United States Patent [19]
Holloway et al.

[11] Patent Number: 4,845,047
[45] Date of Patent: Jul. 4, 1989

[54] THRESHOLD ADJUSTMENT METHOD FOR AN IGFET

[75] Inventors: Thomas C. Holloway; Roger A. Haken; Richard A. Chapman, all of Dallas, Tex.

[73] Assignee: Texas Instruments Incorporated, Dallas, Tex.

[21] Appl. No.: 66,911

[22] Filed: Jun. 25, 1987

[51] Int. Cl.$^4$ .................. H01L 21/322; H01L 29/78
[52] U.S. Cl. ........................... 437/45; 357/23.12
[58] Field of Search ............................. 437/45, 41

[56] References Cited

U.S. PATENT DOCUMENTS 4,336,647 6/1982 McElroy ........................... 437/45

FOREIGN PATENT DOCUMENTS 0087368 7/1981 Japan ........................... 437/45
0198753 9/1986 Japan ........................... 437/45

Primary Examiner—Olik Chaudhuri
Attorney, Agent, or Firm—Larry C. Schroeder; Leo N. Heiting; Melvin Sharp

[57] ABSTRACT

Polysilicon gate insulated gate field effect transistors with threshold adjustment implants made after the gate oxide (156) and a split of the polysilicon gate (158) have been formed provides a shallow, tight dopant profile.

6 Claims, 7 Drawing Sheets

THRESHOLD ADJUSTMENT METHOD FOR AN IGFET

BACKGROUND OF THE INVENTION

1. Field of the Invention

The present invention relates to electronic semiconductor devices and methods of fabrication, and, more particularly, to threshold adjustment for insulated gate field effect transistors and integrated circuits with such transistors.

2. Description of the Related Art

Very large scale integrated semiconductor circuits such as dRAMs are typically fabricated with metal oxide silicon field effect transistors (MOSFETs). The electrical characteristics of MOSFETs of a given size can be adjusted by techniques such as use of lightly doped drains, threshold adjustment implants, polysilicon gates, and so forth. As the number of MOSFETs per chip is increased, the MOSFET feature size is downscaled, and this leads to thinner gate oxides, shallower junctions, increased doping levels, lower operating voltages, etc. and makes the achievement of good electrical characteristics more difficult. See generally H. Shichijo, A Re-Examination of Practical Scalability Limits of N-Channel and P-Channel MOS Devices for VLSI. 1981 IEDM 210 and references cited therein.

The threshold adjustment implant has been commonplace since the advent of ion implantation, and the first technique widely used was implanting p or n type dopants through the gate oxide prior to deposition of the gate. This technique has the problem of exposing the gate oxide to several processing steps, and the gate oxide integrity is compromised. This problem is exacerbated by downscaling due to the decreasing thickness of the gate oxide.

An alternative threshold adjustment implant technique is to implant through a dummy gate oxide which is later stripped and the true gate oxide grown followed immediately by the gate deposition. (Note that the range of boron implanted at 30 keV is about 1,000 Å, which is too large for threshold adjustment if the implant were into the silicon without a dummy gate oxide, and that 30 keV is the lowest practical implant energy for obtaining high beam currents.) This technique yields good gate oxide integrity, but the growth of the gate oxide subsequent to the threshold implant implies high temperature processing steps and a diffusion of the threshold implant dopants. Further, implanted boron segregates into the oxide during the growth; so the net effect is to have an undesirably deep implant. This leads to an increased body effect in n channel transistors and an increased short channel threshold rolloff due to a deeper buried channel.

A variation of the alternative threshold adjustment implant technique is to grow the gate oxide at low temperature to limit the implant dopant diffusion. However, low temperature gate oxide growth leads to generally degraded quality of both the gate oxide and the interface of the gate oxide with the silicon. In particular, both the oxide fixed charge and the interfacial trapped charge increase with decreasing processing temperature; further, oxide density and intrinsic stress increase substantially for oxides grown below 1,000° C. See G.Lucovsky et al. Low-Temperature Growth of Silicon Dioxide Films: A Study of Chemical Bonding by Ellipsometry and Infrared Spectroscopy, 5 J. Vac. Sci. Tech. B 530 (1987).

Thus it is a problem in the known threshold adjustment implant methods and threshold adjusted devices to have both good quality gate oxide plus a tight, shallow dopant profile.

SUMMARY OF THE INVENTION

The present invention provides threshold adjustment implant for a silicon field effect transistor by implantation through a first split of a polysilicon gate plus gate oxide followed by completion of the gate. This permits a tight, shallow dopant profile plus high quality gate oxide and oxide/silicon interface and solves the problems of diffused and segregated implanted dopants in the known threshold adjustment methods and devices.

BRIEF DESCRIPTION OF THE DRAWINGS

The drawings are schematic for clarity.

DESCRIPTION OF THE PREFERRED EMBODIMENTS

Figure 1:
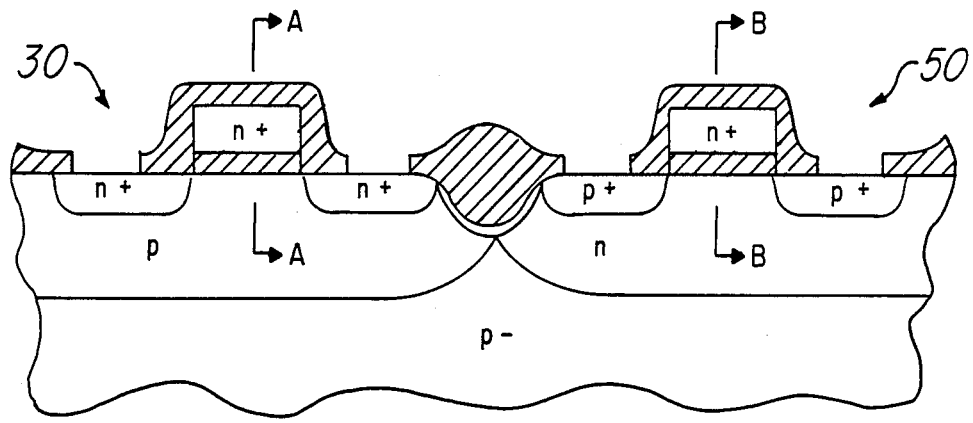
FIG. 1 shows in cross sectional elevation view prior art CMOS transistors.

The preferred embodiment devices and methods are best described after a consideration of known devices and methods. FIG. 1 shows in cross sectional elevation view a standard n channel insulated gate field effect transistor 30 and a standard p channel insulated gate field effect transistor 50 in a single silicon substrate as typically found in CMOS integrated circuits; interconnections, passivation, and packaging have been omitted for clarity. Transistor 30 is turned on by a gate-to-source voltage, $V_{GSn}$, greater than the threshold voltage for the n channel transistor, $V_{Tn}$, and transistor 50 is turned on by a gate-to-source voltage, $V_{GSp}$, less than the threshold voltage of a p channel transistor, $V_{Tp}$. Typically, $V_{Tn} > 0$ and $V_{Tp} < 0$, so transistors 30 and 50 are turned on for $V_{GSn} > V_{Tn} > 0$ and $V_{GSp} < V_{Tp} > 0$. Expressions for the threshold voltages can be derived for long channel transistors; for example see Sze, Physics of Semiconductor Devices §8.2 (2d Ed, Wiley-Interscience 1981):

$$V_{Tn} = V_{FBn} + 2|\psi_p| + \sqrt{2\epsilon q N_A(2\psi_p + V_{BSn})}/C$$

Figure 2:
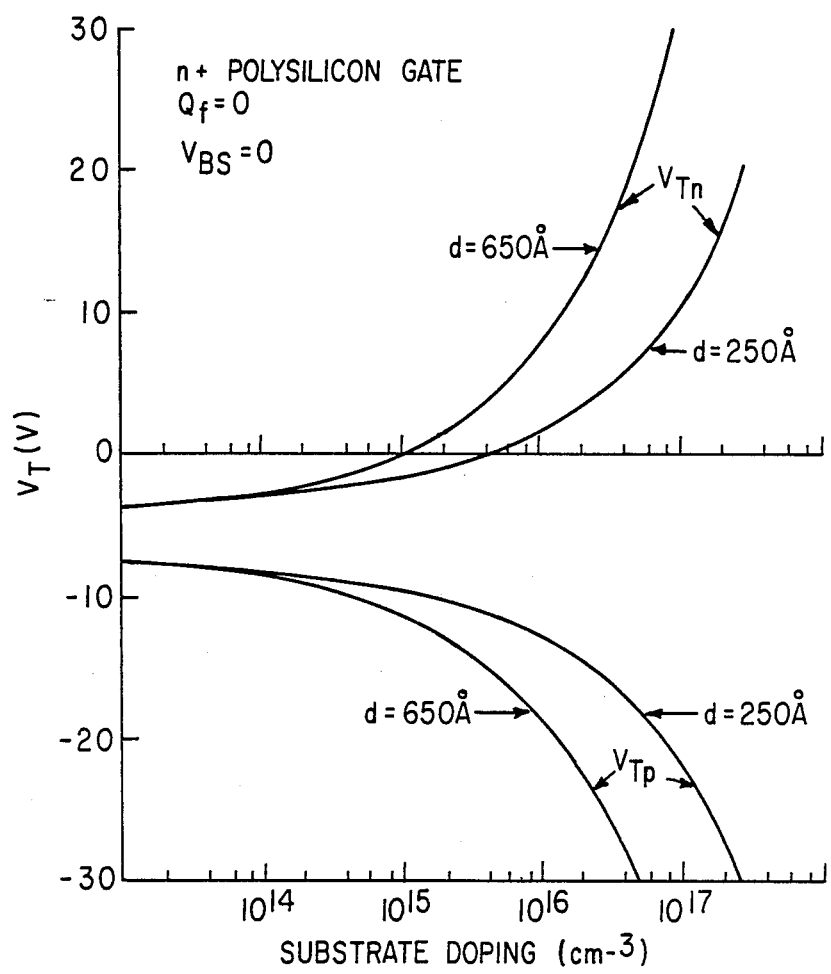
FIG. 2 illustrates threshold voltage dependence on doping level.

-continued $$V_{Tp} = V_{FBp} - 2|\psi_n| - \sqrt{2\epsilon q N_D(2\psi_n + V_{BSp})}/C$$

where $V_{FB}$ is the flatband voltage which depends upon work function differences of the gate and semiconductor material and fixed charges in the gate insulator and at the insulator-semiconductor interface, $\psi_p$ is (1)/q times the difference between the intrinsic energy level and the Fermi level in the bulk p silicon well and $\psi_n$ the corresponding quantity for the n well. $V_{BS}$ is the potential difference between the transistor source and the body (substrate). $N_A$ and $N_D$ are the uniform substrate doping densities, $\epsilon$ is the permittivity of silicon, and C is the gate oxide capacitance per area. $V_{Tn}$ may be either positive or negative, depending upon doping level, because the flatband voltage is typically negative, whereas $V_{Tp}$ is typically always negative; see FIG. 2 illustrating the dependence of threshold voltage on doping level.

Figure 3A:
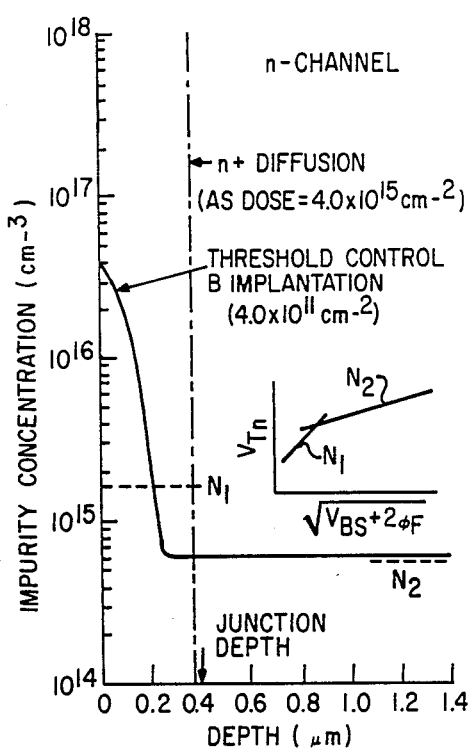
FIGS. 3A-B are threshold-adjustment implant profiles.
Figure 3B:
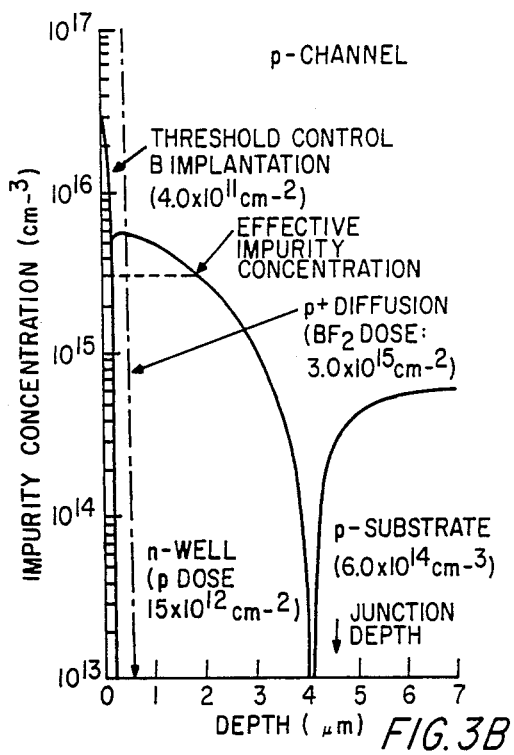
Figure 4:
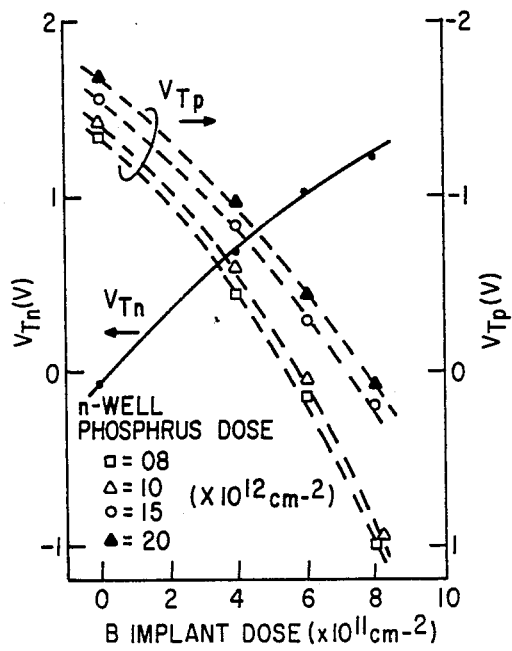
FIG. 4 illustrates threshold voltage dependence on threshold-adjustment dose.

Threshold voltages can adjusted by implanting dopants into the channel region to locally adjust the doping levels $N_A$ and $N_D$. With a blanket shallow boron implant an n channel transistor has an increased net doping level in the channel region, so $V_{Tn}$ is increased, and a p channel transistor has a decreased net doping level in the channel region, so $V_{Tp}$ is increased (less negative). FIGS. 3A-B are idealized doping profiles along lines A—A and B—B, respectively, in FIG. 1 which illustrate threshold adjustment boron implants (the curves are approximations for diffusion from a limited source on the surface—thus the peak is at the surface). Note that the change of polarity of the dopants in the p channel region implies a buried channel because the valence band edge maximum is away from the interface between the silicon and the gate oxide. FIG. 4 illustrates the change of threshold voltage with change in the boron threshold-adjustment implant dose.

Figure 5:
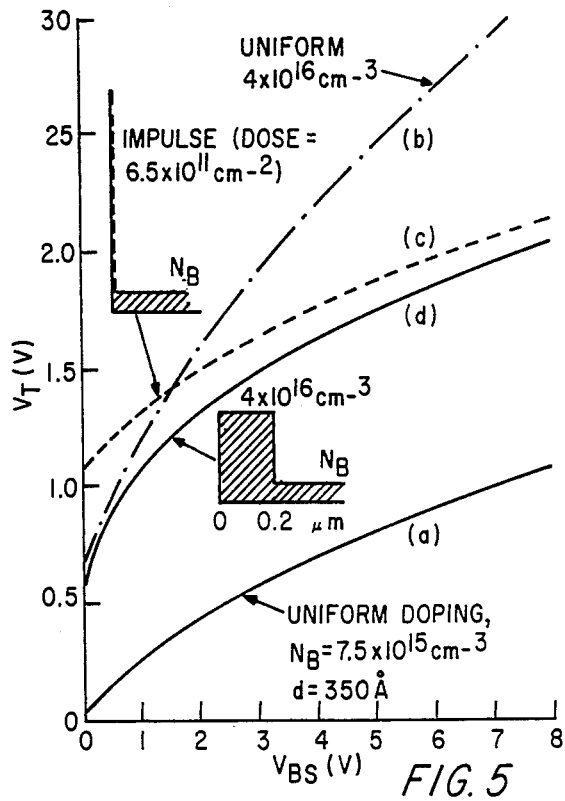
FIG. 5 illustrates body effect dependence on threshold-adjustment profile.
Figure 6A:
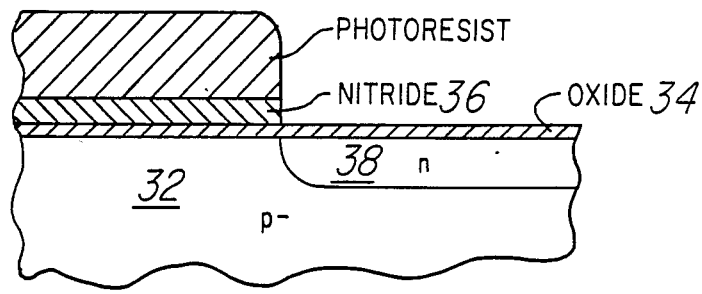
FIGS. 6A-F show in cross sectional elevation view steps in a prior art method of fabrication of CMOS transistors.
Figure 6B:
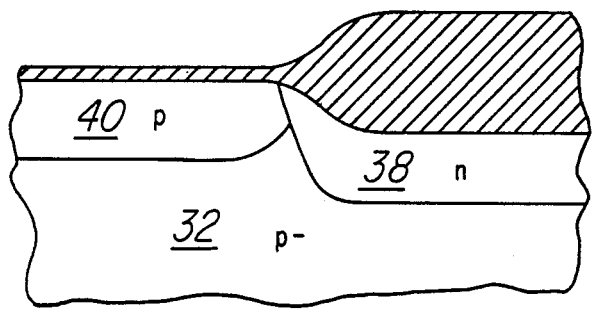
Figure 6C:
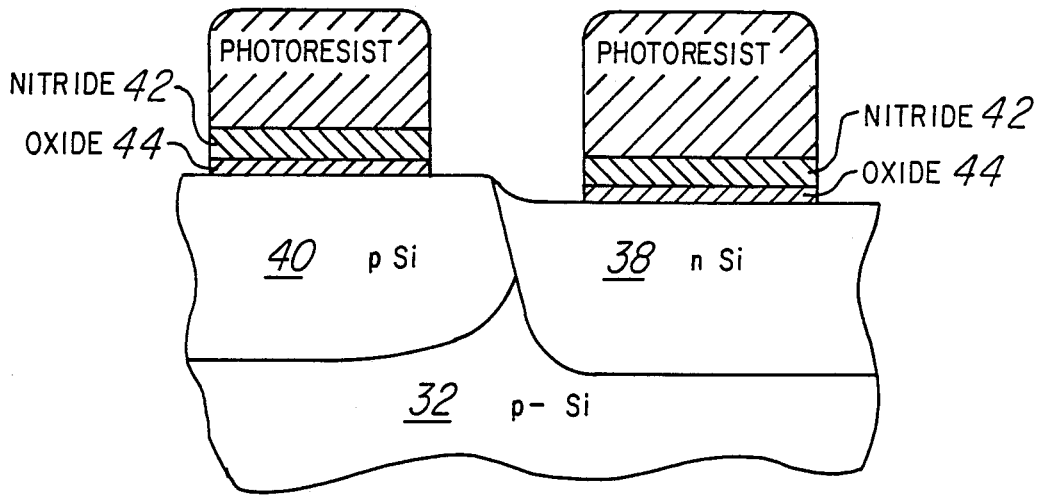
Figure 6D:
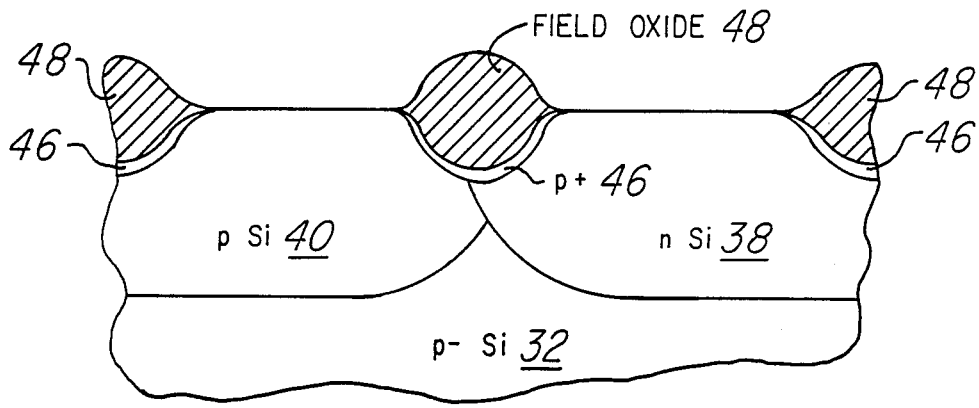
Figure 6E:
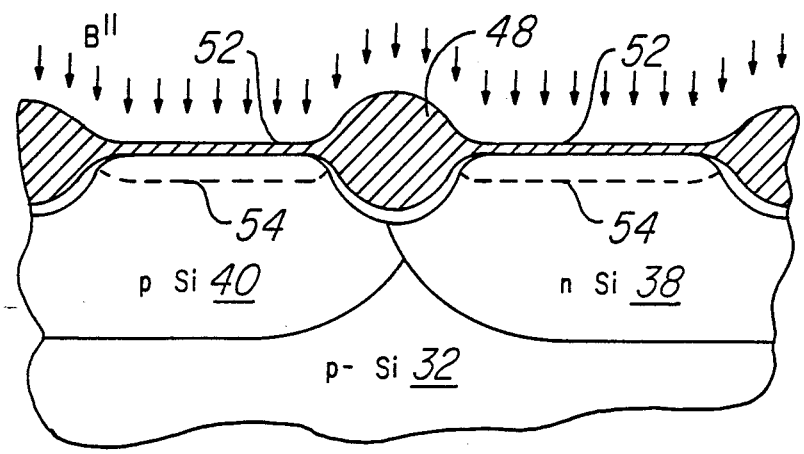
Figure 6F:
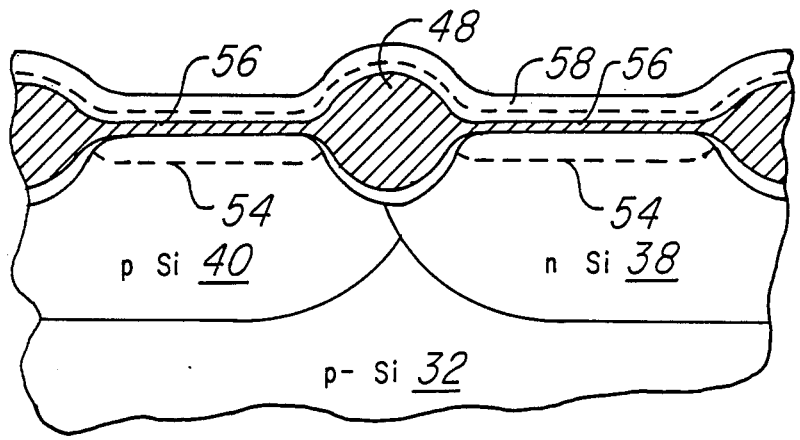

The expressions above show the dependent of the threshold voltages upon the source-substrate bias (the body effect), and a minimal sensitivity for such dependence is preferable. FIG. 5 compares the dependence of the sensitivity for two idealized doping profiles; the shallower, tighter profile shows less sensitivity at low substrate bias (curve (c) versus curve (d)). (The body effect is frequently empirically approximated with a constant K by:

$$\Delta V_T = K\sqrt{|V_{BS}|}$$

and a smaller K is better.)

A threshold adjustment implant of dopants of the same conductivity type as the substrate leads to two possibilities: (1) the effective depth of the implant is greater than the width of the depletion region at threshold, and (2) the implanted ions are all contained within the surface space-charge region. In case (1) the doping near the substrate edge of the junction leads to higher substrate capacitance and lower breakdown voltage in the channel region as well as to greater sensitivity of $V_T$ to substrate bias (the body effect). Thus case (2) is preferred, and shallow adjustment implants are required. Further, as feature size is downscaled the depth of the source and drain junctions is decreased and the doping level increased which implies even shallower adjustment implants.

FIGS. 6A-F illustrate in cross sectional elevation views a standard CMOS process for fabrication of transistors 30 and 65 including the following steps.

(a) Grow 350 Å thick silicon dioxide 34 on silicon substrate 32, and deposit by LPCVD 1,000 Å silicon nitride 36. Photolithographically define n well 38, plasma etch nitride 36 over the n well, and implant phosphorus through oxide 34 to dope n well 38. See FIG. 6A.

(b) Strip the photoresist and grow oxide over n well 38 in steam at 1,000° C. to a thickness of 5,000 Å. Note that the phosphorus segregates into silicon so the oxidation snowplows the phosphorus into the silicon. Nitride 36 prevents oxidation away from n well 38. Etch nitride 36 and implant boron to dope p well 40 with the oxide on n well 38 masking the implant. See FIG. 6B.

(c) Etch the oxide over n well 38. Grow 350 Å thick oxide 44 and drive-in the n and p well dopants at 1,100° C. Deposit 1,400 Å thick nitride 42 by LPCVD. Photolithographically define the active areas (moats) and etch nitride 42 and oxide 44 away from the moats. See FIG. 6C.

(d) Implant channel stop boron 46, and strip the photoresist. Grow 7,000 Å thick field oxide 48 in steam at 900° C.: Nitride 42 acts as an oxidation barrier. Etch nitride 42 and etch 350 Å of oxide; this just removes all the oxide from the moats. See FIG. 6D.

(e) Grow dummy gate oxide 52 to a thickness of 250 Å in steam at 900° C. Implant threshold-adjustment boron 54 at 30 keV and a dose of $1.8 \times 10^{12}/cm^2$; the implant is done with the ion beam tilted about 7° from perpendicular to the substrate to avoid channeling. The projected range of the boron is about 1,000 Å and the projected straggle is about 400 Å; thus the peak boron concentration is about 750 Å into the silicon. The implant is not activated because subsequent processing will subject the substrate to sufficiently high temperatures. See FIG. 6E.

Figure 7:
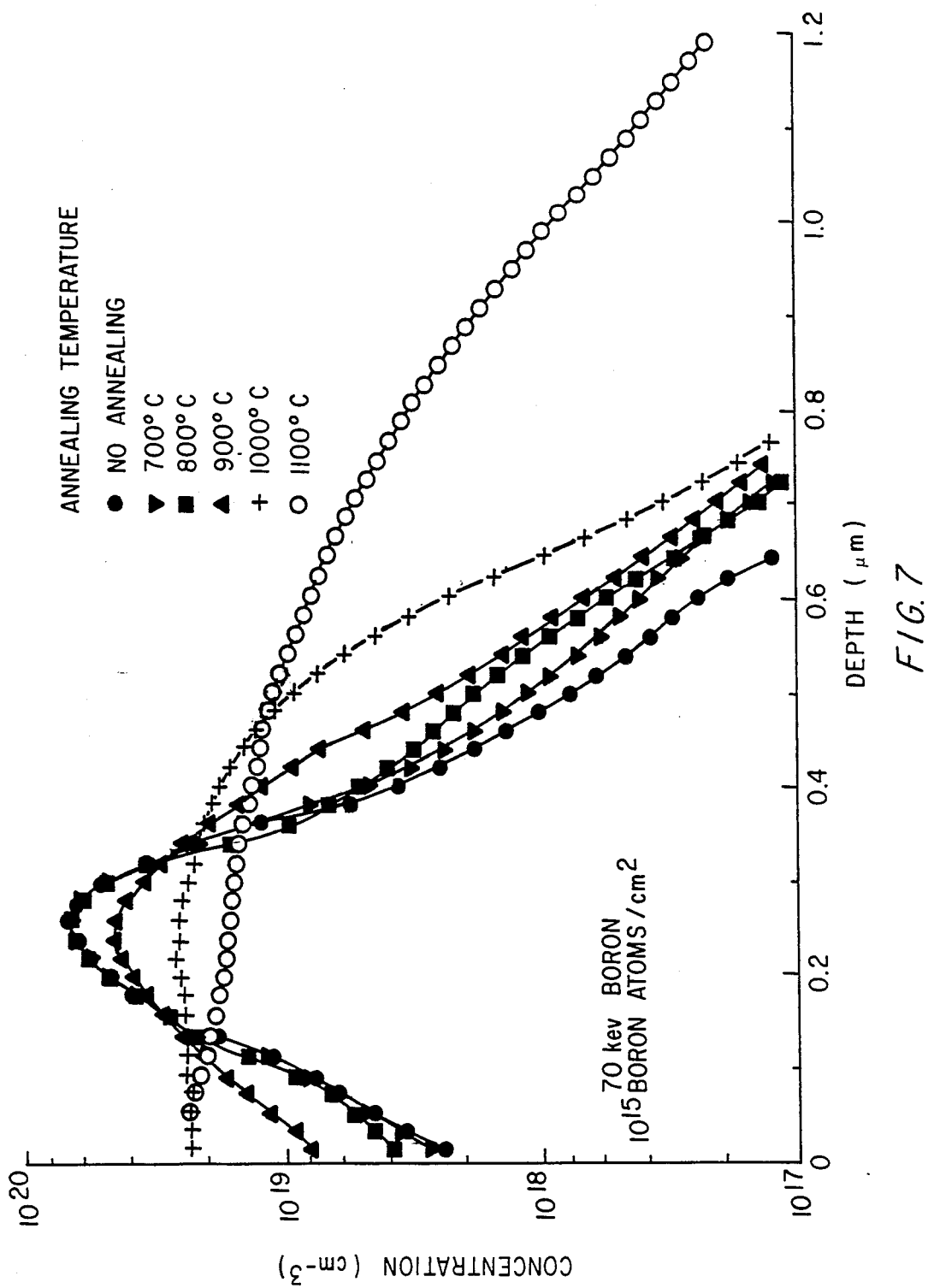
FIG. 7 illustrates diffusion of boron at various temperatures.

(f) Wet etch dummy gate oxide 52 and grow gate oxide 56 in oxygen plus HCl at 950° C. for thirty minutes to a thickness of 250 Å. This thirty minutes at 950° C. activates implanted boron 54 and also (undesirably) diffuses it into the silicon plus (undesirably) segregates it into the growing oxide. See FIG. 7 which illustrates boron diffusion at various temperatures. Deposit by LPCVD a first split of polysilicon 58 to a thickness of 1.250 Å. This deposition uses the decomposition of silane at temperatures in the range of 600° to 650° C.; such low temperatures have no measurable effect on the threshold boron. If buried contacts from polysilicon 58 to the moats are required, then the first split of polysilicon 58 is patterned and etched plus oxide 56 etched to form openings for the buried contacts. Next, the second split of polysilicon 58 is deposited by LPCVD to a thickness of 3.250 Å (for a total polysilicon 58 thickness of 4,500 Å) and contacts the moats through any buried contact openings.

(g) Dope polysilicon 58 n⁻ by diffusing in phosphorus from POCl₃ at 950° C. for twenty minutes. This twenty minutes at 950° C. further diffuses boron 54. Photolithographically define the gates for transistors 30 and 50, and etch polysilicon 58 for form the gates. Photolithographically define and implant (arsenic, phosphorus, and boron) sources and drains for transistors 30 and 50, and activate the implants at 900° C. for sixty minutes. Deposit TEOS oxide and photolithographically form openings to contact the sources and drains. This completes the transistors as shown in FIG. 1, and typically further steps of metallization, passivation, and packaging follow.

Figure 8:
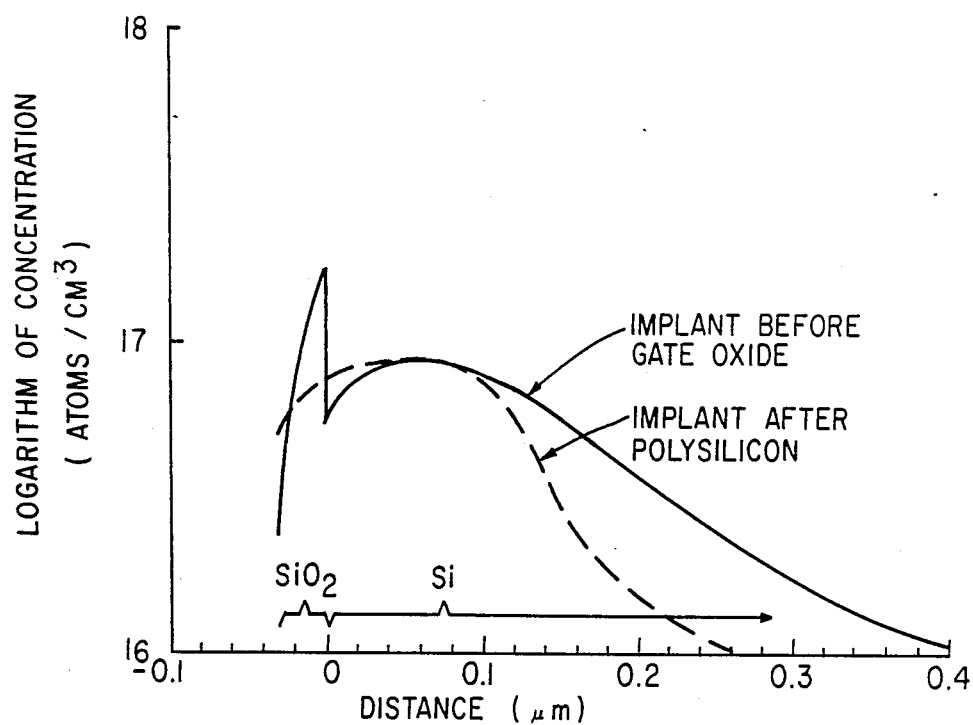
FIG. 8 compares prior art and first preferred embodiment threshold-adjustment implant profiles.

The first preferred embodiment n and p channel transistors 130 and 150 are similar to transistors 30 and 50 but with a shallower, tighter threshold-adjustment boron profile. That is, FIG. 1 is also a cross sectional elevation view of transistors 130 and 150 because the threshold-adjustment implant is not explicit in FIG. 1. The shallower, tighter boron profile derives from implanting the boron after a first split of the gate polysilicon has been deposited; this requires a higher energy implant but avoids the diffusion accompanying gate oxide growth. FIG. 8 shows the boron threshold-adjustment implant profiles in transistors 30 and 130, respectively, as simulated by computer and includes the boron in the gate oxide. Note that the growth of the gate oxide after the boron implant in transistor 30 leads to the segregation of boron into the gate oxide, but there is no such segregation in transistor 130. Also, the higher energy of the boron implant for transistor 130 (see the following description of the method of fabrication) implies a larger projected straggle, but the extra high temperature processing of gate oxide growth for transistor 30 implies a greater diffusion of the implanted boron which more than offsets its smaller projected straggle. For example, the projected straggle for a 20 keV boron implant (as could be used for transistor 30) is 283 Å, and the projected straggle for a 60 keV boron implant (as could be used for transistor 130) is 556 Å (data from Gibbons et al. Projected Range Statistics). Thus transistor 30 has an initial advantage of 273 Å. But an estimate of the increase in "straggle" due to growth of gate oxide 250 Å thick at 950° C. is $2\sqrt{Dt} \approx 800$ Å (see A. Grove, Physics and Technology of Semiconductor Devices (Wiley, 1967)). Thus the diffusion during gate oxide growth for transistor 30 more than offsets the larger straggle from the higher implant energy for transistor 130. Lower temperature (900° C.) growth of the gate oxide for transistor 30 is possible using steam, and at this temperature the diffusion $2\sqrt{Dt}$ would be comparable to the extra straggle from the 60 keV implant for transistor 130; however, transistor 130 could also be formed with a lower energy boron implant (such as 45 keV) through a thinner first split of the polysilicon gate, and this would diminish the initial straggle difference. Indeed, the first split of polysilicon could be as thin as 300–500 Å and still provide continuous coverage and protection of the gate oxide and permit implantation through the polysilicon and gate oxide at energies only slightly greater than used for implantation through a dummy gate.

Further characteristics of transistors 130 and 150 are apparent from a consideration of the first preferred embodiment method of fabrication which includes the following steps:

(a) Follow steps of (a) through (d) of the prior art method previously described, and grow the dummy gate oxide as in step (e) of the prior art method.

Figure 9:
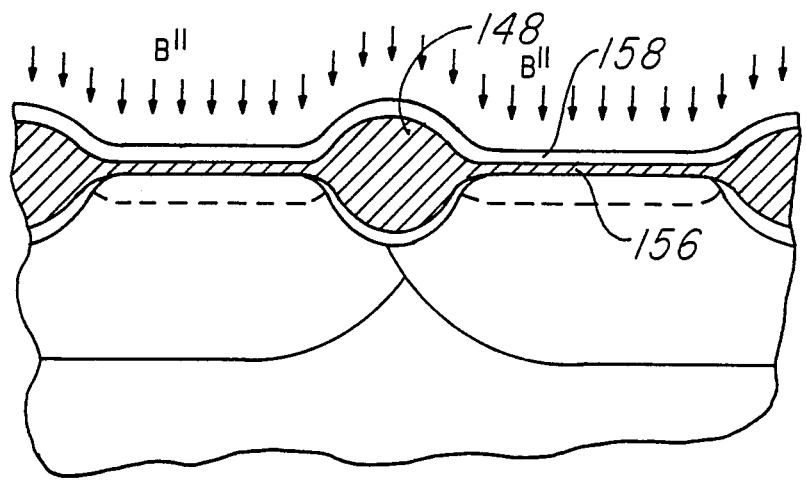
FIG. 9 shows in cross sectional elevation view the implant step of the first preferred embodiment method of fabrication.

(b) Wet etch the dummy gate oxide and grow 250 < gate oxide 156 as in step (f) of the prior art method. Deposit by LPCVD the first split of polysilicon 158 to a thickness of 1.250 < as in step (f) of the prior art method. Now implant threshold-adjustment boron 154 at 60 keV and a dose of $1.25 \times 10^{12}/cm^2$; the implant is done with the ion beam tilted about 7° from perpendicular to the substrate to avoid channeling. The projected range of the boron is about 2,000 Å and the projected straggle is about 550 Å; thus the peak boron concentration is about 500 Å into the silicon. The implant is not annealed because subsequent processing will subject the substrate to sufficiently high temperatures to activate the boron. See FIG. 9 which illustrates the implant through the first split of polysilicon 158.

(c) Continue as in steps (f) and (g) of the prior art method with patterning the first split of polysilicon 158 for buried contacts, if any, deposition of the second split of polysilicon 158, and so forth.

Second preferred embodiment methods of fabrication follow the first preferred embodiment method except for the replacement of the high temperatures of the $POCl_3$ diffusion to dope the polysilicon in step (c) (and step (g) of the prior art method) with an insitu phosphorus doping of the polysilicon or an implantation plus activation anneal doping of the polysilicon or a combination of both or even in combination with $POCl_3$ doping. The first and second splits of polysilicon could be doped by different methods.

The change from the prior art method to the preferred embodiment methods lies in performance of the threshold-adjustment implantation after the gate oxide has been grown and a first split of the polysilicon has been deposited. This has the advantages of not subjecting the threshold-adjustment implanted boron to the high temperature gate oxide growth (which diffuses the implant and segregates it into the oxide) but preserves the gate oxide quality because polysilicon is deposited immediately after gate oxide growth. Also, the energy of the threshold-adjustment implant through both the polysilicon plus gate oxide (typically 60 keV) is convenient because low energies (below 30 kev) are difficult to control with high currents.

Figure 10:
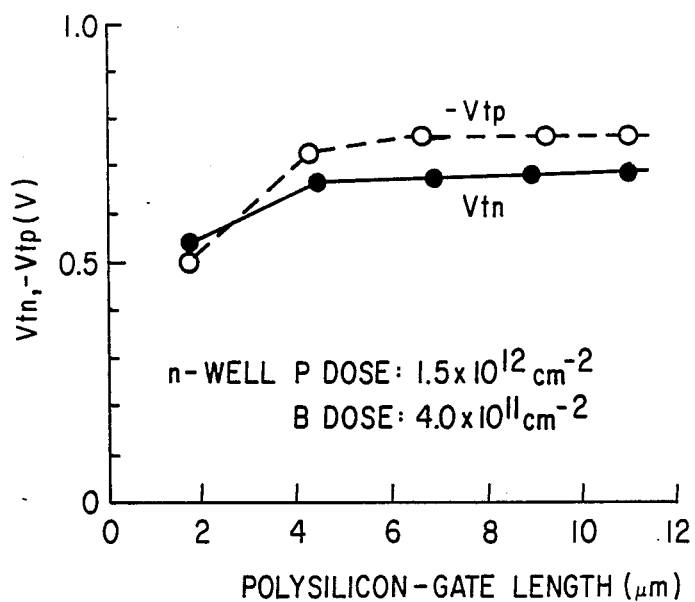
FIG. 10 illustrates threshold voltage rolloff with decreasing gate length.

As the channel length of transistors 30 and 50 is downscaled, various short channel effects occur. One effect is the rolloff of the threshold voltages $V_{Tn}$ and $V_{Tp}$ as a function of gate length; see FIG. 10. The threshold-adjustment implant profile affects this rolloff with shallower, tighter profiles showing less rolloff. Thus transistors 130 and 150 will show less rolloff of the threshold voltages as the channel length is decreased below one μm than transistors 30 and 50.

The preferred embodiment preforms the $V_T$ implant through the gate oxide with a partial deposition (about 1,000 Å) of the gate electrode (amorphous silicon). This approach uses higher implant energies while reducing the depth of the boron dopant in the silicon, and device modeling predicts a significant reduction in NMOS body effect over the normal process. Experimental results show a body effect of 0.35 for a 1.25 μm patterned gate length as compared to the normal body effect of 0.49. Also, $V_T$ data from two enclosed FET test lots (one NMOS and one PMOS) indicate that an unmasked Vt implant can be used for this approach so that an additional mask is not required for gate oxide thicknesses from 200 to 250 Å.

Test results of simultaneously fabricated transistors 30 and 130 of long and short channels:

| $V_T$ Implant | $V_{TO}$ | Body Effect | |
|---|---|---|---|
| | | L = 8 um | L = 1.25 um |
| 1.2E12 @ 60 keV through poly | 0.8 V | 0.55–0.56 | 0.33–0.34 |
| Standard process | 0.9 V | 0.80 | 0.61 |
| 1.3E12 @ 60 keV through poly | 1.1 V | 0.62–0.63 | 0.42–0.43 |

This data shows the body effect using the implant through the polysilicon gate (transistor 130) is lower than using the standard dummy gate approach (transistor 30) for comparable threshold voltages.

Modeled predictions using MINIMOS and SUPREM2 generated doping profiles for 1 μm gate length are:

|  | $V_{TO}$ | Body Effect |
|---|---|---|
| Standard process | 0.75 | 0.48 |
| $V_T$ implant through poly | 0.75 | 0.26 |

Additional testing of the NMOS devices has shown low body effects can be obtained without degrading short channel performance, particularly, the drain effect. Also, the implant energy is a significant factor in obtaining low body effects with a 60 keV implant giving a body effect of about 0.4 and a 45 keV implant giving a body effect of about 0.3. Again, no significant difference in drain effect was observed.

IMPLANTATION THROUGH PARTIAL GATE ELECTRODE

| Implant | Length | Body Effect | $V_T$ Vd = 0.05 V | $V_T$ Vd = 5 V | Drain Effect |
|---|---|---|---|---|---|
| 1.1E12 @ 60 keV | 1.2 um | 0.41 | 0.67 | 0.61 | 0.03 |
|  | 0.8 um | 0.32 |  |  |  |
| 1.1E12 @ 45 keV | 1.2 um | 0.33 | 0.72 | 0.65 | 0.03 |
|  | 0.8 um | 0.24 |  |  |  |

A standard cell lot was processed in order to target the correct threshold adjusting implant for a $V_T$ implant through a 1,000 Å thick polysilicon layer and the following results were obtained;

| Vt Implant | NMOS |  |  | PMOS |  |  |
|---|---|---|---|---|---|---|
|  | Vt0 | BE | Gain | Vt0 | BE | Gain |
| Standard thru dummy gate | 0.83 | 0.59 | 40 | 0.84 | 0.50 | 17.4 |
| Vt thru poly |  |  |  |  |  |  |
| 9E11 @ 60 kev | 0.85 | 0.36 | 39 | 0.9 | 0.56 | 16.0 |
| 1.1E12 @ 60 kev | 0.95 | 0.39 | 38 | 0.87 | 0.56 | 16.7 |
| 1.3E12 @ 60 kev | 1.05 | 0.44 | 37 | 0.74 | 0.56 | 17.4 |

The resulting sharper $V_T$ implant dopant distribution for the $V_T$ implant through polysilicon has impact on several device parameters, the most significant of which is the reduction of NMOS body effect for comparable threshold voltages by about 30%. This sharper distribution causes less deep compensation of the n-well, however, and slightly higher PMOS body effects (10%) are observed. Also, there is less of a buried channel in the PMOS devices resulting in a slightly lower gain for the p-channel transistors. The reduction in n-channel gain for higher implant dosages is due to increased surface impurity scattering due to the higher impurity concentration, but for comparable threshold voltages the gain is equivalent to the standard $V_T$ implant through the dummy gate process.

MODIFICATIONS AND ADVANTAGES

Various modifications of the preferred embodiment devices and methods may be made while retaining the features of a shallow, tight threshold adjustment implant profile. For example, NMOS, PMOS, and BiCMOS devices could be used in place of the preferred embodiment CMOS devices; the dimensions and shapes of the device elements could be varied; the threshold adjustment implant may be through the entire polysilicon gate and the gate may be subsequently silicided; the threshold adjustment implant may be masked (such as only adjusting the n-channel transistors) and may be done at different energies for selected groups of transistors; the silicon substrate may be replaced by silicon-on-insulator or have trench-isolated regions, by germanium, by GaAs-on-silicon with exposed silicon, and so forth; and the materials may be varied such as refractory metal or polycide (silicided polysilicon such as titanium silicide or tungsten silicide) gates, gallium arsenide channel regions, silicon nitride or oxide/nitride stack or $CaF_2$ gate insulators, phosphorus implanted dopants, and so forth. Implantation through various gate materials (such as tungsten, molybdenum, etc.) and gate insulator materials will have a variety of projected ranges and minimal continuous coverage thicknesses for deposition, so the implantation energies and gate and insulator thicknesses of the preferred embodiments will be replaced by quantities appropriate for the materials and thicknesses.

The invention provides the advantages of a shallow, tight threshold adjustment implant profile with a method using convenient implant energies by performing the implant after at least a portion of a gate has been deposited.

What is claimed is:

1. A method of fabrication of insulated gate field effect transistors, comprising the steps of:
   (a) form a gate insulator on a semiconductor layer;
   (b) deposit gate electrode on said gate insulator;
   (c) implant threshold-adjustment dopants through both said gate insulator and said gate material; and then
   (d) form source and drain regions.

2. The method of claim 1, wherein:
   (a) said semiconductor layer is silicon;
   (b) said gate insulator is silicon dioxide;
   (c) said gate electrode is polysilicon; and
   (d) said dopant is boron.

3. The method of claim 1, wherein:
   (a) said semiconductor layer is silicon;
   (b) said gate electrode is refractory metal; and
   (c) said dopant is boron.

4. The method of fabrication of integrated circuits, comprising the steps of:
   (a) forming gate insulator on regions of a semiconductor substrate;
   (b) depositing a first layer of conductive gate material on said gate insulator;
   (c) implanting threshold-adjustment dopants through both said conductive gate material and said gate insulator;
   (d) depositing a second layer of conductive gate material on said first layer;
   (e) patterning and etching field effect transistor gates in said layers of conductive gate material;
   (f) forming source and drain regions adjacent a plurality of said transistor gates;
   (g) forming source and drain contacts and interconnections; and
   (h) depositing passivation material.

5. The method of claim 4, wherein;
   (a) said semiconductor layer is silicon;
   (b) said gate insulator is silicon dioxide;

(c) said conductive gate material is polysilicon; and
(d) said dopant is boron.

6. The method of claim 4, wherein;
(a) said semiconductor layer is silicon;

(b) said conductive gate material is refractory metal; and
(c) said dopant is boron.

* * * * *